United States Patent
Rossi et al.

(10) Patent No.: US 8,289,635 B2
(45) Date of Patent: Oct. 16, 2012

(54) WAFER STACK, INTEGRATED OPTICAL DEVICE AND METHOD FOR FABRICATING THE SAME

(75) Inventors: Markus Rossi, Jona (CH); Hartmut Rudmann, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 88 days.

(21) Appl. No.: 12/809,362

(22) PCT Filed: Dec. 16, 2008

(86) PCT No.: PCT/CH2008/000532
§ 371 (c)(1),
(2), (4) Date: Sep. 16, 2010

(87) PCT Pub. No.: WO2009/076788
PCT Pub. Date: Jun. 25, 2009

(65) Prior Publication Data
US 2011/0013292 A1    Jan. 20, 2011

Related U.S. Application Data

(60) Provisional application No. 61/014,808, filed on Dec. 19, 2007.

(51) Int. Cl.
*G02B 9/00* (2006.01)
*G02B 7/02* (2006.01)

(52) U.S. Cl. ........................ 359/796; 359/811
(58) Field of Classification Search .......... 348/335, 348/340; 359/622, 796, 797, 811
See application file for complete search history.

(56) References Cited

U.S. PATENT DOCUMENTS

| | | | |
|---|---|---|---|
| 6,324,010 B1 * | 11/2001 | Bowen et al. | 359/622 |
| 6,903,883 B2 * | 6/2005 | Amanai | 359/819 |
| 2001/0008287 A1 | 7/2001 | Kraiczek et al. | |
| 2004/0169763 A1 * | 9/2004 | Ikeda | 348/340 |
| 2007/0126912 A1 * | 6/2007 | De Bruin et al. | 348/340 |
| 2011/0211102 A1 * | 9/2011 | Yamada et al. | 348/302 |

FOREIGN PATENT DOCUMENTS

| | | |
|---|---|---|
| DE | 201 00 418 | 4/2001 |
| EP | 1 434 426 | 6/2004 |
| EP | 1 653 520 | 5/2006 |
| JP | 58-141562 | 8/1983 |
| WO | 2005/041561 | 5/2005 |
| WO | 2008/011003 | 1/2008 |

OTHER PUBLICATIONS

Written Opinion of the International Searching Authority (PCT/ISA/237) prepared for PCT/CH2008/000532 on Jun. 19, 2010.*

* cited by examiner

Primary Examiner — David N Spector
(74) Attorney, Agent, or Firm — Rankin, Hill & Clark LLP

(57) ABSTRACT

In a method for fabricating an integrated optical device by creating a wafer stack by stacking at least a top wafer carrying as functional elements a plurality of lenses on at least one further wafer including further functional elements, and separating the wafer stack into a plurality of integrated optical devices, wherein corresponding functional elements of the top and further wafer are aligned with each other and define a plurality of main optical axes, a method for providing a sunshade plate as part of an integrated optical device (10), including the steps of: providing a sunshade plate having a plurality of through holes, the through holes being arranged to correspond to the arrangement of the functional elements on the top wafer; and stacking the sunshade plate on the top wafer, with the through holes being aligned with said main optical axes.

12 Claims, 1 Drawing Sheet

WAFER STACK, INTEGRATED OPTICAL DEVICE AND METHOD FOR FABRICATING THE SAME

BACKGROUND OF THE INVENTION

1. Field of the Invention

The invention is in the field of integrated optical devices, in particular integrated camera modules with an image capturing element, such as a CCD sensor, and at least one lens element for imaging an object on the image capturing element, e.g. a refractive and/or diffractive lens. Integrated device means that all components are arranged in a well defined spatial relationship. Such integrated camera modules are, for example, cameras of mobile phones which are preferably manufactured in a mass production process at low cost.

More concretely, the invention relates to an optical device for a camera module comprising a baffle that defines a predetermined field of view (FOV) of the image capturing device, while suppressing beam paths coming from points outside this FOV. The invention further relates to a wafer scale package representing a plurality of such optical devices, to a baffle array with a plurality of baffles and to methods for manufacturing a plurality of camera modules and for manufacturing a baffle substrate.

2. Description of Related Art

Especially in the field of mobile phones with cameras, but also for other applications, it is desirable to have a camera module that can be mass produced at low cost in an as simple process as possible and still has a good image quality. Such camera modules comprise an image capturing element and at least one lens element arranged along a common axis and are known from WO 2004/027880, for example. The known camera modules are manufactured on a wafer scale by replicating a plurality of lens elements on a disk-like substrate (wafer), stacking and connecting the substrates to form a wafer scale package (wafer stack) and dicing the stack in order to separate the individual camera modules from one another.

The camera modules are integrated optical devices, which include functional elements such as the image capturing device and the at least one lens stacked together along the general direction of light propagation. These elements are arranged in a predetermined spatial relationship with respect to one another (integrated device) such that further alignment with each other is not needed, leaving only the integrated device as such to be aligned with other systems.

Wafer-scale replication of lens elements allows the fabrication of several hundreds of generally identical devices with a single step, e.g. a single or double-sided UV-embossing process. Replication techniques include injection molding, roller hot embossing, flat-bed hot embossing, and UV embossing. As an example, in the UV embossing process, the surface topology of a master structure is replicated into a thin film of a UV-curable replication material such as an UV curable epoxy resin on top of a substrate. The replicated surface topology can be a refractive or a diffractive optically effective structure, or a combination of both. For replicating, a replication tool bearing a plurality of replication sections that are a negative copy of the optical structures to be manufactured is prepared, e.g. from a master. The tool is then used to UV-emboss the epoxy resin. The master can be a lithographically fabricated structure in fused silica or silicon, a laser or e-beam written structure, a diamond turned structure or any other type of structure. The master may also be a submaster produced in a multi stage generation process by replication from a (super) master.

A substrate or wafer in the meaning used in this text is a disc or a rectangular plate or a plate of any other shape of any dimensionally stable, often transparent material. The diameter of a wafer disk is typically between 5 cm and 40 cm, for example between 10 cm and 31 cm. Often it is cylindrical with a diameter of either 2, 4, 6, 8 or 12 inches, one inch being about 2.54 cm. The wafer thickness is, for example, between 0.2 mm and 10 mm, typically between 0.4 mm and 6 mm.

If light needs to travel through the substrate, the substrate is at least partially transparent. Otherwise, the substrate can be nontransparent as well. In case of a camera module, at least one substrate bears electro-optical components, like the image capturing device, and may thus be a silicon or GaAs or other semiconductor based wafer; it may also be a CMOS wafer or a wafer carrying CCD arrays or an array of Position Sensitive Detectors.

Such integrated optical devices can be manufactured by stacking wafers along the axis corresponding to the direction of the smallest wafer dimension (axial direction). The wafers comprise functional elements, like lens elements or image capturing elements, in a well defined spatial arrangement on the wafer. By choosing this spatial arrangement in an adequate way, a wafer stack comprising a plurality of generally identical integrated optical devices can be formed, wherein the elements of the optical device have a well defined spatial relationship with respect to one another and define a main optical axis of the device.

By spacer means, e.g. a plurality of separated spacers or an interconnected spacer matrix as disclosed in US 2003/0010431 or WO 2004/027880, the wafers can be spaced from one another, and lens elements can also be arranged between the wafers on a wafer surface facing another wafer.

It is known to place a sunshade or baffle in front of the top lens element of a camera module. A sunshade or baffle is an element that defines a field of view (FOV) of the image capturing element by suppressing beam paths coming from points outside this FOV. Known baffles consist of a layer of non-transparent material having a given thickness in an axial direction and a through-hole for light transmission. The through-hole generally defines a cone with a given extent in the axial direction through which light can pass. The thickness as well as the shape of the side walls of the through hole determines the FOV and the maximum angle (collection angle) under which incident light can pass the baffle and enter the camera module. It is often desired that the collection angle does not exceed a predetermined value. This is because light entering the device under higher angles is stray light and/or may not directly fall onto the photosensitive part of the image capturing element but may hit the photosensitive part only after one or more reflections inside the camera module. This may lead to artifacts in the image generated by the image capturing element, and thus to a reduced image quality.

Known baffles have thus a thickness of several 100 µm (e.g. 100-300 µm) and side walls of the through hole which are tapered with an angle of 25-35° with respect to the normal direction of the front wall such that an opening with a varying cross section having a diameter in the range of 1-3 mm is formed. This restricts the full angle of the field of view to about 50 to 70°.

Known baffles are normally made as separate parts. They are attached to the integrated camera module only after its complete manufacture, i.e. after the dicing step if a wafer scale manufacturing process is employed. The additional steps of attaching each individual baffle to each individual camera module associated therewith is time-consuming and complicated and, thus, another disadvantage of known modules and manufacturing processes.

EP 1 434 426 discloses a wafer-scale manufacturing method for integrated camera modules in which an non-transparent iris film comprising holes is deposited as a top layer on a wafer from which later individual camera modules are diced. The iris material is made of a film such as an acrylic film or a polyolefin film, and is bonded to an underlying IR filter plate. Alternatively, the iris material may be formed by printing a light shielding material on a surface of the IR filter or on a lens body. Thus, being very thin, the iris film does not stop stray light from entering the camera at angles that are almost parallel to the plane of the iris film.

A further disadvantage is that the optical system, or at least the top lens element or the iris layer, is fully accessible via the through hole. This may lead to damage and contamination.

BRIEF SUMMARY OF THE INVENTION

It is a further object of the invention to provide an integrated optical device that can be manufactured in a mass production process at low cost, and a corresponding manufacturing process.

It is a further object of the invention to provide a wafer scale package comprising a plurality of generally identical camera or optical device modules.

It is a further object of the invention to provide a sunshade plate with a plurality of sunshade elements and a corresponding manufacturing method.

These objects are achieved by a a method for providing a sunshade plate, a wafer stack, an integrated optical device and a sunshade plate according to the corresponding independent claims. Preferred embodiments are described in the dependent claims and the description and are shown in the drawings.

The method for providing a sunshade plate is part of a method for fabricating an integrated optical device by creating a wafer stack by stacking at least a top wafer carrying as functional elements a plurality of lenses on at least one further wafer comprising further functional elements, and separating (dicing) the wafer stack into a plurality of integrated optical devices, wherein corresponding functional elements of the top and further wafer are aligned with each other and define a plurality of main optical axes. The method for providing a sunshade plate as part of an integrated optical device comprises the steps of:

providing a sunshade plate comprising a plurality of through holes, the through holes being arranged to correspond to the arrangement of the functional elements on the top wafer;

stacking the sunshade plate on the top wafer, with the through holes being aligned with said main optical axes.

This allows one to provide, after dicing, a complete integrated optical device module which includes a sunshade. No further steps for adding a sunshade are required. The optical device may comprise an imaging chip, making it an integrated camera module.

In a preferred embodiment of the invention, the method comprises the further step of stacking a transparent cover plate on the sunshade plate prior to cutting the wafer stack into individual optical devices. As a result, the integrated camera module also comprises a protective cover, and the camera module may be installed in a consumer product such as a mobile phone without the need for a protective plate being mounted on the camera or being provided as part of the housing of the consumer product.

In the above method, the step of stacking usually includes gluing or bonding the layers being stacked together, e.g. by means of an adhesive. The wafer stack constitutes a wafer scale package.

A single integrated camera module is manufactured from a wafer stack or wafer package by separating (dicing or cutting) said wafer stack into a plurality of integrated camera modules.

Further preferred embodiments are evident from the dependent patent claims. Features of the method claims may be combined with features of the device claims and vice versa.

BRIEF DESCRIPTION OF THE DRAWINGS

The subject matter of the invention will be explained in more detail in the following text with reference to preferred exemplary embodiments which are illustrated in the attached drawings, which show schematically, in FIG. 1 an elevated view of a sunshade plate.

The reference symbols used in the drawings, and their meanings, are listed in summary form in the list of reference symbols. In principle, identical parts are provided with the same reference symbols in the figures.

DETAILED DESCRIPTION OF PREFERRED EMBODIMENTS

Figure 1:
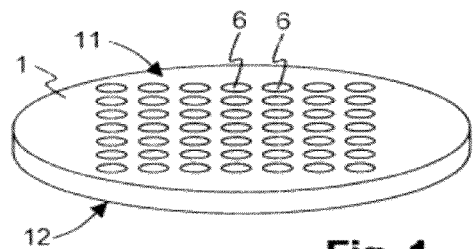

FIG. 1 schematically shows an elevated view of a sunshade plate. The sunshade plate 1 is wafer-sized and comprises a plurality of through holes 6, typically arranged in a grid or array. The through holes 6 extend from a top surface 11 to a bottom surface 12 of the sunshade plate 1 and preferably are conical in shape.

Figure 2:
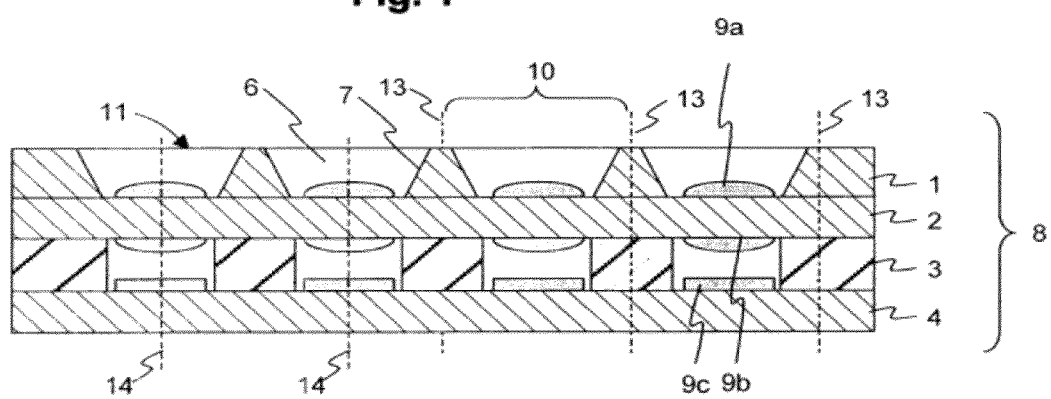
FIGS. 2 and 3 lateral cut-away views of wafer stacks with a sunshade plate.
Figure 3:
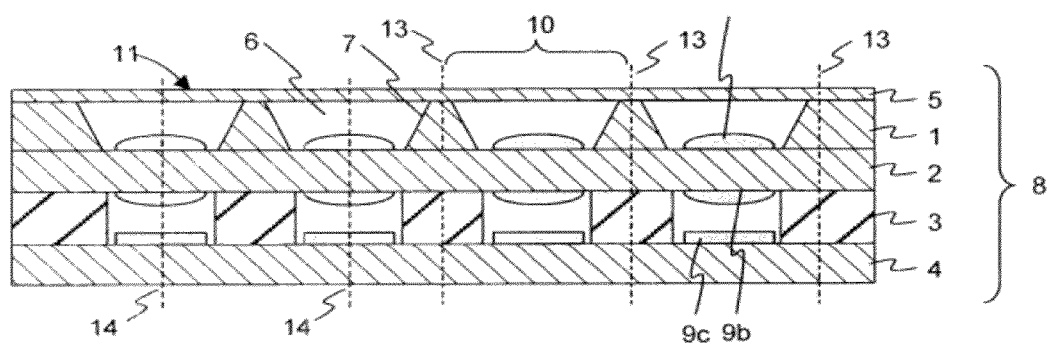

FIGS. 2 and 3 show lateral cut-away views of wafer stacks 8 with a sunshade plate 1. A wafer stack 8 comprises, from top to bottom, a sunshade plate 1 stacked on a top wafer 2 carrying functional elements, for example, a first lens 9a and second lens 9b. Alternatively, the top wafer 2 may carry only lenses on its top or only on its bottom surface. The lenses may be fabricated on the top wafer 2 by means of a replication process, or may be shaped into the top wafer 2 itself. The top wafer 2 is stacked on a further wafer 4 from which it may be separated by a spacer wafer 3. The further wafer 4 carries, as further functional elements, imaging or camera chips 9c. Each camera chip 9c is aligned with a corresponding lens or set of lenses 9a, 9b, thus forming, together with the surrounding structural elements 2, 3, 4 an integrated camera. Each such integrated camera or integrated optical device defines a main optical axis 14. FIG. 3 shows a different embodiment from that of FIG. 2, in that it additionally comprises a transparent cover plate 5 stacked on the sunshade plate 1. Further embodiments may comprise further layers of e.g. lenses arranged between the top wafer 2 and the further wafer 4.

Layers of adhesive that may lie between the various layers, and electrical connections to the camera chips 9c are not shown in the figures.

The through holes 6 in the sunshade plate 1 comprise side walls 7, typically conical shaped, which are tapered with an angle of 20-40°, preferably 25-35° with respect to the normal direction of the sunshade plate 1 or its top surface 11. The exact angle is determined according to camera specifications and usually is about 2° more than the camera's field of view.

Alternatively, the side walls may be vertical or may be tapered in the other direction, i.e. opening up towards the bottom. In other embodiments of the invention, the side walls are not straight, but rounded or chamfered.

The thickness of the sunshade plate 1 is in the range of 0.1 to 0.5 or 1 millimeters, the width of the top opening of the through hole 6 being ca. 1 to 3 or 5 millimeters, and the width of the bottom opening being e.g. around 0.3 millimeters.

The sunshade plate 1 is preferably made of an optically non-transparent material. The manufacturing process for the sunshade plate 1 itself may be molding, stamping, or another replication process. As material, preferably a plastic material such as a thermoplast or an epoxy, with or without filler material, is used.

Figure 4:
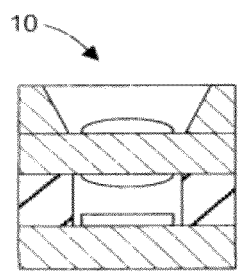
FIGS. 4 and 5 lateral cut-away views of integrated camera modules.
Figure 5:
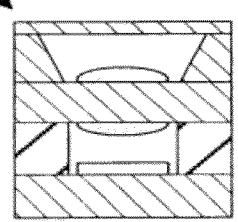

The method for manufacturing a wafer stack comprises the steps of stacking the wafers and spacers constituting the wafer stack, including the sunshade plate 1 and optionally the cover plate 5. The method for manufacturing an individual optical element comprises the further step of dicing the wafer stack 8, separating it into a plurality of integrated camera devices 10. Corresponding dicing lines 13 are shown in the FIGS. 2 and 3. FIGS. 4 and 5 show lateral cut-away views of integrated camera modules generated by this separating step.

While the invention has been described in present preferred embodiments of the invention, it is distinctly understood that the invention is not limited thereto, but may be otherwise variously embodied and practised within the scope of the claims.

LIST OF DESIGNATIONS

1 sunshade plate
2 top wafer
3 spacer wafer
4 further wafer
5 cover plate
6 through hole, aperture hole
7 side wall
8 wafer stack
9*a* first lens
9*b* second lens
9*c* camera chip
10 integrated camera device
11 top surface
12 bottom surface
13 dicing lines
14 optical axe

The invention claimed is:

1. A method for fabricating an integrated optical device comprising the steps of:
   creating a wafer stack by stacking at least a top wafer carrying as functional elements a plurality of lenses, on at least one further wafer comprising further functional elements, and
   providing a sunshade plate as part of the integrated optical device by:
      providing a sunshade plate comprising a plurality of through holes, the through holes being arranged to correspond to the arrangement of the functional elements on the top wafer wherein the sides of the through holes are tapered and have an angle between 20-40° with respect to the normal of the sunshade plate; and
      stacking the sunshade plate on the top wafer, with the through holes being aligned with said main optical axes
   separating the wafer stack into a plurality of integrated optical devices, wherein corresponding functional elements of the top and further wafer are aligned with each other and define a plurality of main optical axes, each axis corresponding to one integrated optical device.

2. The method of claim 1, comprising the further step of stacking a transparent cover plate on the sunshade plate prior to separating the wafer stack into individual optical devices.

3. A wafer stack for the fabrication of integrated optical devices, the wafer stack comprising:
   at least a top wafer carrying as functional elements a plurality of lenses,
   at least one further wafer comprising further functional elements, the top wafer being stacked on the further wafer,
   wherein corresponding functional elements of the top and further wafer are aligned with each other and define a plurality of main optical axes, and
   wherein the wafer stack further comprises a sunshade plate comprising a plurality of through holes, the sunshade plate being stacked on the top wafer, with the through holes being arranged with said main optical axes, and
   wherein the sides of the through holes are tapered and have an angle between 20-40° with respect to the normal of the sunshade plate.

4. The wafer stack of claim 3, wherein the sunshade plate is made of an optically non-transparent material.

5. An integrated optical device, manufactured from a wafer stack according to claim 3 by separating said wafer stack into a plurality of integrated optical devices.

6. The wafer stack of claim 3, wherein the through holes have an angle between 25-35° with respect to the normal of the sunshade plate.

7. The wafer stack of claim 3, wherein the thickness of the sunshade plate is in the range of 0.1 to 1 millimeters.

8. The wafer stack of claim 7, wherein the sunshade plate is made of an optically non-transparent material.

9. The wafer stack of claim 3, further comprising a transparent cover plate stacked on the sunshade plate.

10. The wafer stack of claim 9, wherein the thickness of the sunshade plate is in the range of 0.1 to 1 millimeters.

11. The wafer stack of claim 9, wherein the sunshade plate is made of an optically non-transparent material.

12. A wafer stack for the fabrication of integrated optical devices, the wafer stack comprising:
   at least a top wafer carrying as functional elements a plurality of lenses,
   at least one further wafer comprising further functional elements, the top wafer being stacked on the further wafer,
   wherein corresponding functional elements of the top and further wafer are aligned with each other and define a plurality of main optical axes, and
   wherein the wafer stack further comprises a sunshade plate comprising a plurality of through holes, the sunshade plate being stacked on the top wafer, with the through holes being arranged with said main optical axes,
   and further comprising a transparent cover plate stacked on the sunshade plate,
   wherein the sides of the through holes are tapered and have an angle between 20-40° with respect to the normal of the sunshade plate.

* * * * *